(12) United States Patent
Hayashi

(10) Patent No.: US 7,136,146 B2
(45) Date of Patent: Nov. 14, 2006

(54) EXPOSURE DEVICE AND EXPOSURE METHOD

(75) Inventor: Satoshi Hayashi, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 14 days.

(21) Appl. No.: 10/841,460

(22) Filed: May 10, 2004

(65) Prior Publication Data
US 2004/0233404 A1    Nov. 25, 2004

(30) Foreign Application Priority Data
May 9, 2003   (JP)  ............................. 2003-131674

(51) Int. Cl.
  *G03B 27/42*  (2006.01)
  *G03B 27/52*  (2006.01)
(52) U.S. Cl. .......................................... 355/53; 355/55
(58) Field of Classification Search ................. 355/52, 355/53, 55, 72–73; 310/10, 12; 378/34, 378/35; 250/548; 361/234; 356/399–401
See application file for complete search history.

(56) References Cited

U.S. PATENT DOCUMENTS 4,475,223 A  * 10/1984 Taniguchi et al. ............ 378/34
5,184,176 A  *  2/1993 Unno et al. ................... 355/52
6,122,036 A  *  9/2000 Yamasaki et al. ............. 355/53

FOREIGN PATENT DOCUMENTS

| JP | 63-86430 A    | 4/1988 |
| JP | 4-214613 A    | 8/1992 |
| JP | A-H06-216220  | 8/1994 |
| JP | A-H07-74088   | 3/1995 |
| JP | A-H10-209030  | 8/1998 |

\* cited by examiner

*Primary Examiner*—Henry Hung Nguyen
(74) *Attorney, Agent, or Firm*—Shinjyu Global IP

(57) ABSTRACT

An exposure device that sequentially projects and repeatedly transfers a predetermined pattern formed on a reticule onto wafers via an optical projection system, the exposure device including a movement unit that positions a current shot region on a wafer in the focal position of the optical projection system, a detection unit that detects tilting on an exposure surface of the current shot region with respect to an image plane of the optical projection system, and a plurality of first piezoelectric elements that correct the tilting on the current shot region with respect to the optical axis, based upon the detection results of the detection unit, so that the exposure surface of the current shot region will substantially match the image plane.

17 Claims, 11 Drawing Sheets

Prior Art

EXPOSURE DEVICE AND EXPOSURE METHOD

BACKGROUND OF THE INVENTION

1. Field of the Invention

The present invention relates to an exposure device and an exposure method.

2. Background Information

A stepper is employed as an exposure device, and serves to form circuit patterns on a semiconductor substrate (such as a silicon wafer and the like) in semiconductor devices, liquid crystal display devices, and the like. The stepper is a device that exposes a plurality of circuit patterns onto a substrate by projecting and repeatedly transferring a reduced version of a circuit pattern formed on a reticle onto the substrate via an optical projection system.

FIG. 9A is a schematic diagram of a conventional stepper used with silicon wafers, and FIG. 9B is an enlarged view of a support portion included in the stepper shown in FIG. 9A. The stepper shown in FIGS. 9A and 9B includes a condenser lens 2 that restricts the light from a light source 1, a reticle 3, an optical projection system 4, a position adjustment unit 5, and a wafer holder 12. A wafer 15 is mounted on the wafer holder 12. The light source 1, the condenser lens 2, the reticle 3, and the optical projection system 4 are sequentially disposed along an optical axis 17 of the light source 1 and perpendicular therewith. The reticle 3 includes a circuit pattern that will be formed on the wafer 15, and receives light from the condenser lens 2. The light that passes through the circuit pattern is projected at a reduced size onto the wafer 15 by means of the optical projection system 4, and is imaged onto the current shot region on the wafer 15.

The position adjustment unit 5 includes an X stage 6, a Y stage 7, a Z stage 8, a θ stage 9, and a leveling stage 10 that are disposed along the optical axis of the optical projections system 4, moves the wafer 15 by means of a motor drive, and positions the current shot region on the wafer 15 in the focal position of the optical projection system 4. Here, the X stage 6 moves the wafer 15 along the X axis of FIG. 9A that is in a plane perpendicular to the optical axis 17, the Y stage 7 moves the wafer 15 along the Y axis of FIG. 9A that is perpendicular to the optical axis 17 and the X axis, the Z stage 8 moves the wafer 15 along the Z axis of FIG. 9A that is parallel to the optical axis 17, and the θ stage 9 rotates the wafer 15 in a plane perpendicular to the optical axis 17. In addition, the leveling stage 10 includes three support portions 11a, 11b, and 11c. The lengths of the support portions 11a–11c are adjusted by means of the motor drive, and, as shown in FIGS. 10 and 11, thereby allow correction of any distortion of the subject image in the image plane (i.e., distortion of the circuit pattern) caused by warping/uneven surfaces located on the surface of the wafer 15 and/or any aberration or distortion in the condenser lens 2 or the lenses inside the optical projection system 4.

FIGS. 10A and 10B illustrate the operation of the leveling stage 10 and the support portions 11 in response to a warp/uneven surface located on the wafer 15. In FIG. 10A, the image plane A from the optical projection system 4 and the exposure surface of the wafer 15 do not match because there is a warp/uneven surfaces located on the wafer 15. Accordingly, as shown in FIG. 10B, the lengths of the support portions 11a–11c on the leveling stage 10 are adjusted to tilt the wafer holder 12 and the wafer 15 so that the image plane A and the exposure surface of the wafer 15 will match.

In addition, FIGS. 11A and 11B illustrate the operation of the leveling stage 10 and the support portions 111 in response to distortion of the subject image in the image plane A caused by an aberration or distortion in one or more of the lenses of the stepper. In FIG. 11A, the image plane A and the exposure surface of the wafer 15 do not match, thereby producing a distortion in the subject image on the exposure surface. Accordingly, as shown in FIG. 11B, the lengths of the support portions 11a–11c on the leveling stage 10 are adjusted to tilt the wafer holder 12 and the wafer 15 so that the image plane A and the exposure surface of the wafer 15 will match.

However, with the stepper disclosed in FIGS. 9A and 9B, the speed at which the lengths of the support portions 11a–11c on the leveling stage 10 are adjusted by the motor drive is slow. Thus, it will take time to correct any distortion of the subject image in the image plane caused by warping/uneven surfaces located on the wafer 15 and/or aberration or distortion in one or more of the lenses, and thus the time needed for the entire exposure process will increase. In addition, electric power consumption costs will increase because the support portions 11a–11c are operated by the motor drive.

Furthermore, it is difficult to perform localized corrections because tilting on the wafer 15 is corrected by adjusting the tilt of the wafer holder 12 by means of the support portions 11a–11c. In addition, even if warping/uneven surfaces located on the wafer 15 and/or aberration or distortion in the lenses is localized, the operational range of the support portions 11a–11c will increase because it will be necessary to adjust the tilting on the entire wafer 15 by means of the support portions 11a–11c. Thus, there will be a large amount of waste with respect to the amount of time the support portions 11a–11c are driven and the amount of electric power consumed therefor. Furthermore, warping/uneven surfaces on the wafer 15 caused by the presence of a foreign substance between the wafer holder 12 and the rear surface of the wafer 15 cannot be corrected by adjusting the tilt of the wafer holder 12.

In view of the above, there exists a need for an exposure device and an exposure method which overcomes the above mentioned problems in the prior art. This invention addresses this need in the prior art as well as other needs, which will become apparent to those skilled in the art from this disclosure.

SUMMARY OF THE INVENTION

An object of the present invention is to provide an exposure device and an exposure method that can shorten the time needed for the entire exposure process.

Another object of the present invention is to provide an exposure device and an exposure method that can reduce electric power consumption.

Yet another object of the present invention is to provide an exposure device and an exposure method that can locally correct warping/uneven surfaces located on a substrate and/or aberration or distortion in the lenses of the exposure device.

Yet another object of the present invention is to provide an exposure device and an exposure method that can reduce warping on a substrate caused by foreign substances on the rear surface of the wafer.

In order to solve the aforementioned problems and achieve the aforementioned objects, an exposure device according to a first aspect of the present invention is provided which repeatedly projects and transfers a predetermined pattern formed on a reticule onto a substrate via an optical projection system, the exposure device including movement means that positions a current shot region on the substrate in a focal position of the optical projection system, detection means that detects tilting of an exposure surface of the current shot region with respect to an image plane of the optical projection system, and a plurality of first piezoelectric elements that correct the tilting of the current shot region with respect to the optical axis, based upon the detection results of the detection means, so that the exposure surface of the current shot region will substantially match the image plane.

Tilting detected by the detection means at the current shot region will be corrected by the first piezoelectric elements. Thus, the speed at which distortion of the subject image in the image plane caused by warping/uneven surfaces located on the substrate and/or aberration or distortion in the lenses of the exposure device are corrected can be increased, and the time needed for the entire exposure process can be shortened. In addition, electric power consumption can be reduced by employing the first piezoelectric elements, and thus the total amount of electric power consumed by the exposure device can be reduced.

In a second aspect of the present invention, the exposure device according to the first aspect further includes fixing means that fixes the substrate to the first piezoelectric elements, and the plurality of first piezoelectric elements are disposed in a predetermined spaced relationship such that they support a rear surface of the substrate.

By supporting and fixing the rear surface of the substrate by means of the first piezoelectric element, the contact surface area between the rear surface of the substrate and the first piezoelectric element can be reduced, and warping/uneven surfaces caused by foreign substances adhered to the rear surface of the substrate can be reduced.

In a third aspect of the present invention, the first piezoelectric elements of the exposure device according to the first aspect are arranged to correspond to tilting detection positions of the detection means.

Because the first piezoelectric elements are arranged to correspond to the detection positions of the detection means, any detected tilting of the exposure surface of the current shot region with respect to the image plane can be properly corrected at the detection positions.

In a fourth aspect of the present invention, the first piezoelectric elements of the exposure device according to the third aspect are arranged such that they substantially correspond to the center and four corners of the current shot region.

Normally, the detection means has 5 detection positions located at the center and the four corners of the current shot region. By arranging the first piezoelectric elements to correspond to the detection positions, and correcting any tilting in the exposure surface of the current shot region with respect to the image plane detected at the 5 detection positions, warping/uneven surfaces located on each current shot region and/or aberration or distortion in the lenses of the exposure device can be properly corrected.

In a fifth aspect of the present invention, the exposure device according the first aspect further includes second piezoelectric elements that move the substrate in directions that are perpendicular to the optical axis.

Misalignment of the substrate can be precisely adjusted by moving the substrate in directions that are perpendicular to the optical axis by means of the second piezoelectric elements. In addition, the amount of electric power consumed by the exposure device can be reduced and the length of time needed for the entire exposure process can be shortened because the second piezoelectric elements are employed to make precise adjustments.

In a sixth aspect of the present invention, the first piezoelectric elements of the exposure device according to the first aspect are piezo elements.

In a seventh aspect of the present invention, the substrate according to the first aspect is a silicon wafer.

In an eighth aspect of the present invention, the substrate according to the first aspect includes a recording media applied thereto.

In a ninth aspect of the present invention, the recording media according to the eighth aspect is a positive resist material.

In a tenth aspect of the present invention, the recording media according to the eighth aspect is a negative resist material.

In an eleventh aspect of the present invention, an exposure method for an exposure device repeatedly projects and transfers a predetermined pattern formed on a reticule onto a substrate via an optical projection system, the exposure method including a substrate fixing step which fixes the substrate to a plurality of first piezoelectric elements arranged in a predetermined spaced relationship such that the first piezoelectric elements support the rear surface of the substrate, a movement step which positions the current shot region on the substrate in a focal position of the optical projection system, a detection step which detects tilting of an exposure surface of the current shot region with respect to an image plane of the optical projection system, and a correction step in which the plurality of first piezoelectric elements correct tilting of the current shot region with respect to the optical axis, based upon the detection results of the detection step, so that the exposure surface of the current shot region will substantially match the image plane.

The tilting detected in the detection step at the current shot region is corrected by the first piezoelectric elements. Thus, the speed at which distortion of the subject image in the image plane caused by warping/uneven surfaces located on the substrate and/or aberration or distortion in the lenses of the exposure device are corrected can be increased, and the time needed for the entire exposure process can be shortened. In addition, electric power consumption can be reduced by employing the first piezoelectric elements, and thus the amount of electric power consumed by the exposure device can be reduced.

Furthermore, because the first piezoelectric elements are used to fix the substrate, the contact surface area between the rear surface of the substrate and the first piezoelectric elements can be reduced, and warping/uneven surfaces caused by foreign substances that have become attached to the rear surface of the substrate can be reduced.

In a twelfth aspect of the present invention, correction is performed in the correction step according to the eleventh aspect by means of the first piezoelectric elements arranged to correspond to tilting detection positions.

Any detected tilting of the exposure surface of the current shot region with respect to the image plane can be properly corrected by means of the first piezoelectric elements arranged to correspond to the detection positions.

In a thirteenth aspect of the present invention, the exposure method according to the eleventh aspect further includes a step in which second piezoelectric elements that move the substrate in directions that are perpendicular to the optical axis cause the detection positions to be substantially matched with the positions of the first piezoelectric elements.

The second piezoelectric elements move the substrate such that the detection positions on the substrate are substantially matched with the positions of the first piezoelectric elements. Thus, the detection positions at which tilting is detected can be matched with the positions of the first piezoelectric elements, and tilting of the exposure surface of the current shot region with respect to the image plane can be properly corrected by means of the first piezoelectric elements arranged at the detection positions.

In a fourteenth aspect of the present invention, the first piezoelectric elements of the exposure method according to the eleventh aspect are piezo elements.

In a fifteenth aspect of the present invention, the substrate according to the eleventh aspect is a silicon wafer.

In a sixteenth aspect of the present invention, the substrate according to the eleventh aspect includes a recording media applied thereto.

In a seventeenth aspect of the present invention, the recording media according to the sixteenth aspect is a positive resist material.

In an eighteenth aspect of the present invention, the recording media according to the sixteenth aspect is a negative resist material.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

First Embodiment

The configuration of a stepper and an exposure method according to a first embodiment of the present invention will be described in detail with reference to FIGS. 1 to 5.

Configuration

Figure 1A:
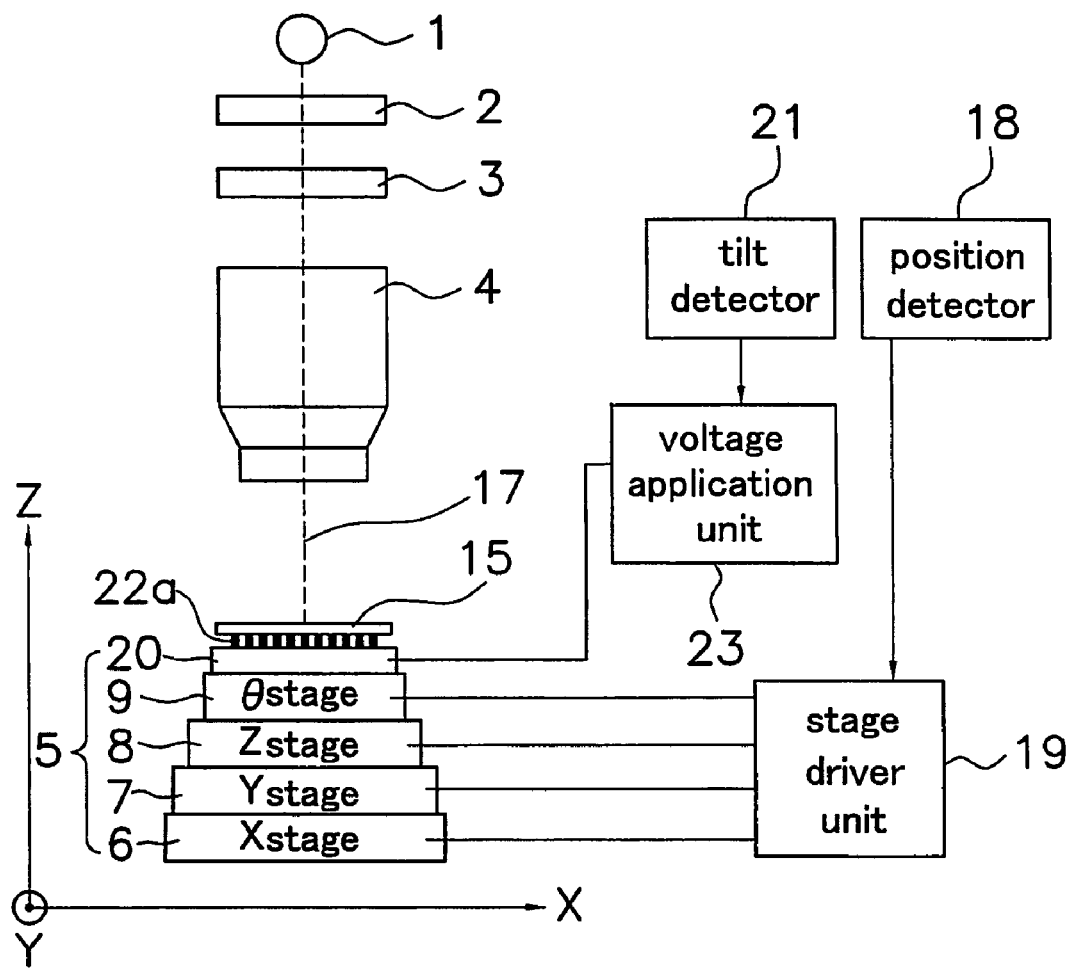
FIG. 1A is a schematic diagram of a stepper according to a first embodiment of the present invention.
Figure 1B:
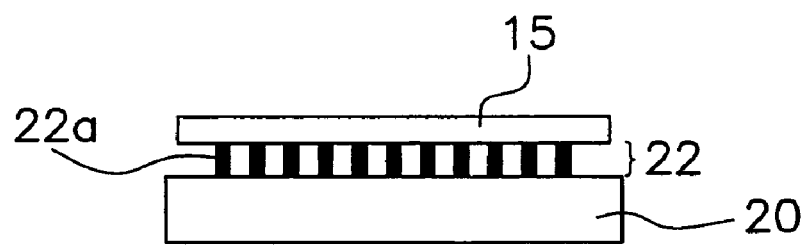
FIG. 1B is an enlarged view of essential elements of the stepper shown in FIG. 1A.
Figure 2:
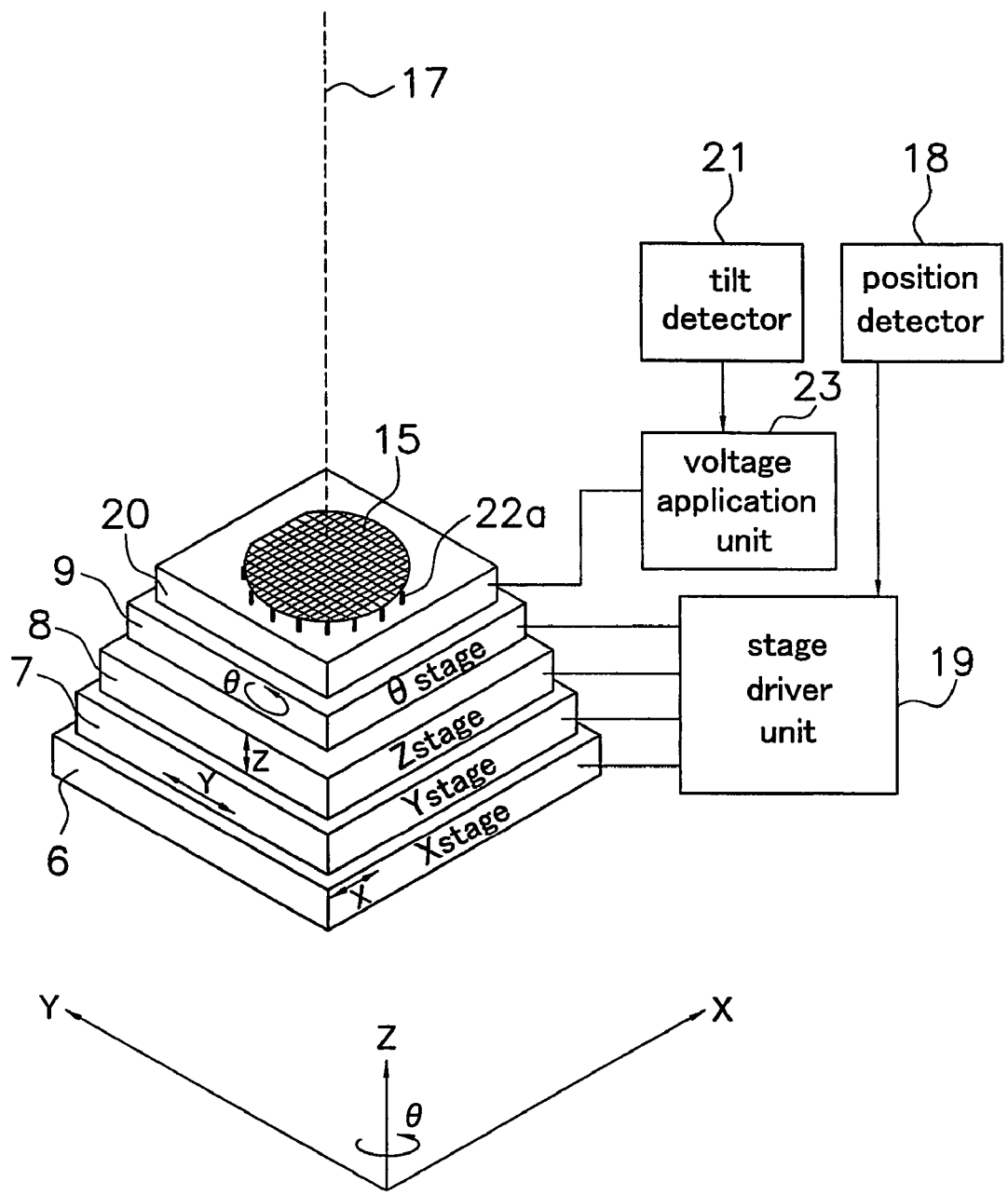
FIG. 2 is a perspective view illustrating the directions in which the stages shown in FIG. 1A move.
Figure 3:
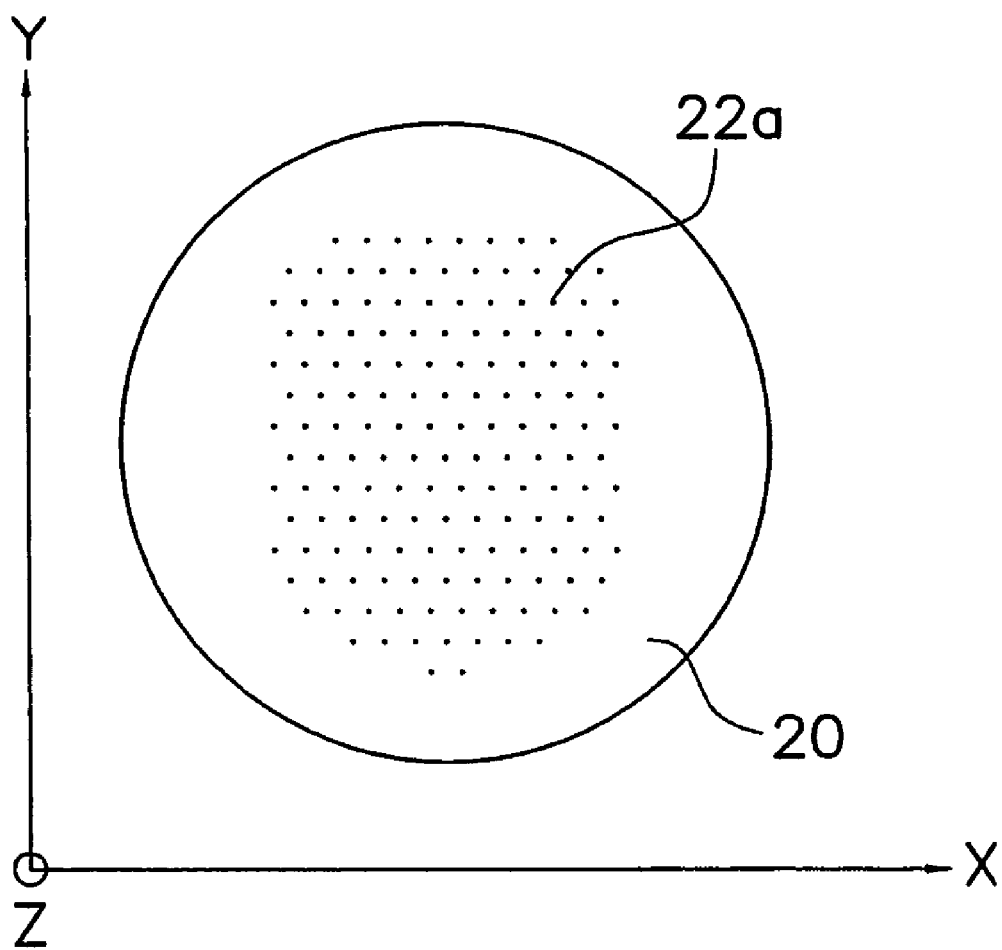
FIG. 3 is a plan view of essential elements of the stepper shown in FIG. 1A.

FIG. 1A is a schematic diagram of the stepper according to the first embodiment of the present invention, FIG. 1B is an enlarged view of essential portions of the stepper of FIG. 1A, FIG. 2 is a perspective view that illustrates the directions in which the stepper of FIG. 1A moves, and FIG. 3 is a plan view of essential portions of the stepper of FIG. 1A.

The stepper shown in FIG. 1 includes a light source 1, a condenser lens 2, a reticule 3, an optical projection system 4, and a position adjustment unit 5. The position adjustment unit 5 is aligned with an optical axis 17 of the optical projection system 4, and includes an X stage 6, a Y stage 7, a Z stage 8, a θ stage 9 and an electrode 20. Here, the X stage 6 moves a wafer 15 along the X axis of FIG. 2 that is in a plane perpendicular to the optical axis 17, the Y stage 7 moves the wafer 15 along the Y axis of FIG. 2 that is perpendicular to the optical axis 17 and the X axis, the Z stage 8 moves the wafer 15 along the Z axis of FIG. 2 that is parallel to the optical axis 17, and the θ stage 9 rotates the wafer 15 in a plane perpendicular to the optical axis 17.

As shown in FIG. 3, the electrode 20 is plate shaped, and has a plurality of piezo elements (hereinafter referred to as Z piezo elements) 22a, 22b, etc. disposed thereon at a predetermined spacing from each other. The Z piezo elements are capable of extending and contracting in the Z axis direction, i.e., the direction perpendicular to the surface of the electrode 20. The wafer 15 is mounted on top of the Z piezo elements 22. Tilting on the wafer 15 can be locally adjusted by independently extending and contracting each Z piezo element 22a, 22b, etc. of the Z piezo elements 22 along the direction perpendicular to the surface of the electrode 20. Examples of the Z piezo elements 22 include cylindrical piezo elements that can be used with a stepper for a 5 inch reticule. The sizes of the piezo elements are periodically determined in response to the reticule or the capabilities of the stepper.

Figure 9A:
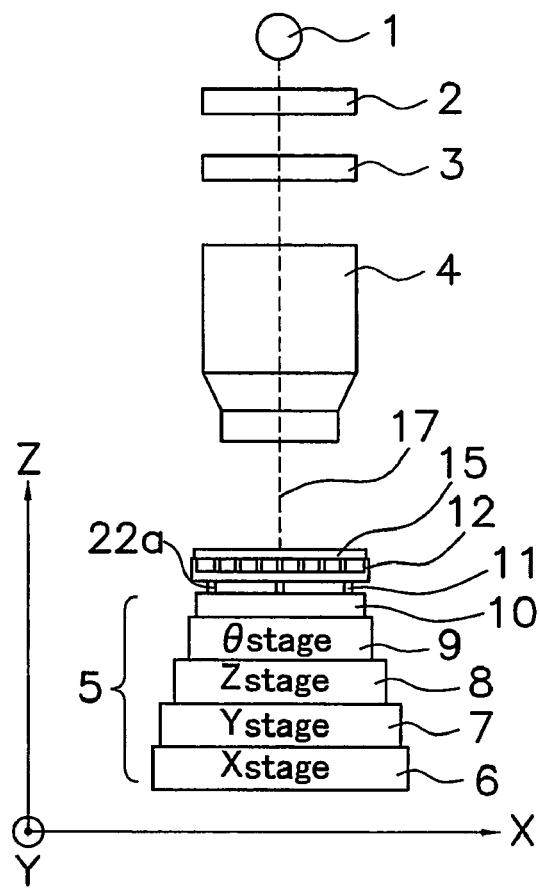
FIG. 9A is a schematic diagram of a conventional stepper.
Figure 9B:
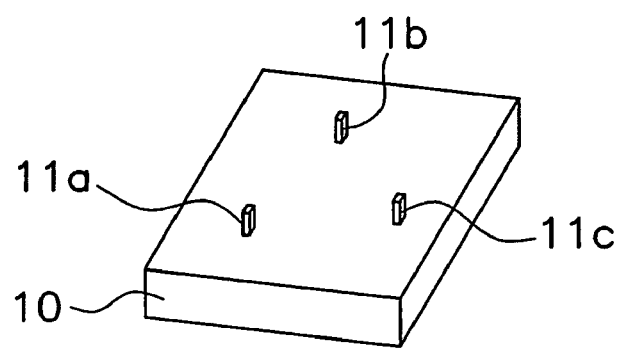
FIG. 9B is an enlarged view of a stage having support portions shown in FIG. 9A.
Figure 10A:
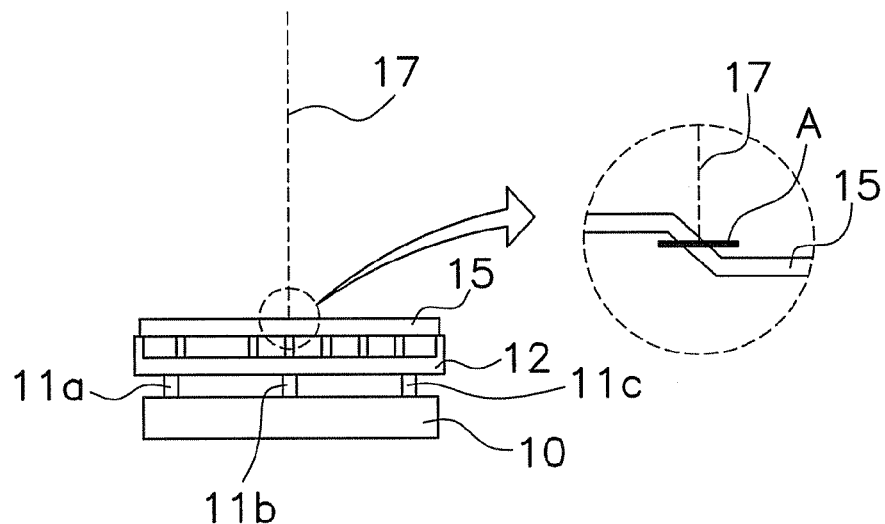
FIG. 10A and FIG. 10B illustrate the operation of a leveling stage and support portions in response to warping/uneven surfaces located on a wafer.
Figure 10B:
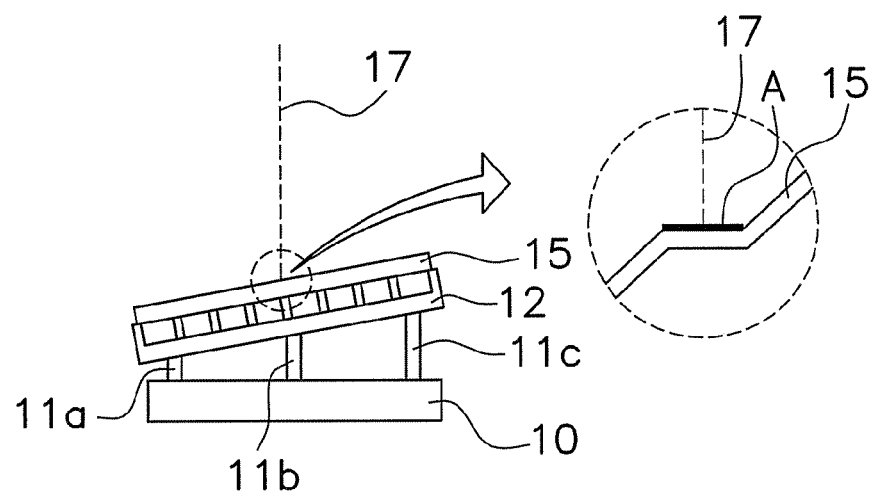
Figure 11A:
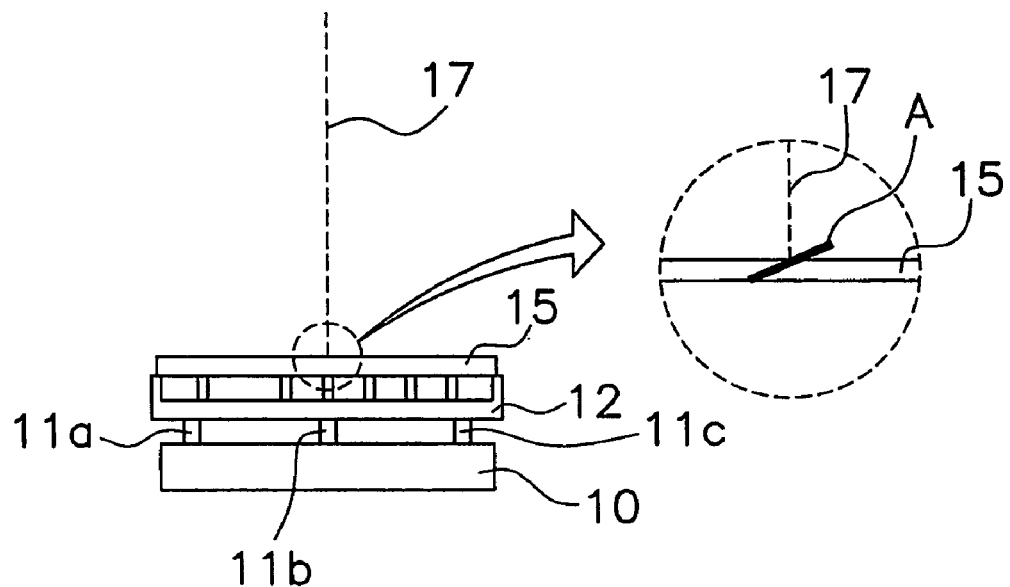
FIG. 11A and FIG. 11B illustrate the operation of a leveling stage and support portions in response to distortion of a subject image in an image plane caused by aberration or distortion in the lenses of an exposure device.
Figure 11B:
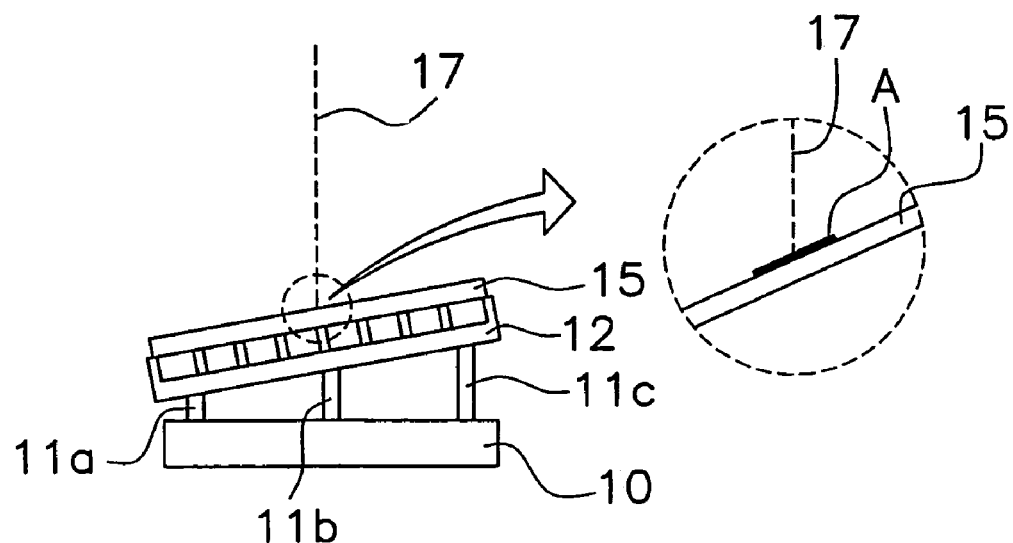

In addition, a position detector 18, a stage drive unit 19, a tilt detector 21, and a voltage application unit 23 are provided in the stepper. The position detector 18 detects the current position of the wafer. The tilt detector 21 detects tilting on the exposure surface of each shot region on the wafer 15 with respect to the optical axis 17. The stage drive unit 19 uses an exposure process software program to position the current exposure region on the wafer 15 in the focal position of the optical projection system 4. Furthermore, the stage drive unit 19 may adjust the current shot position on the wafer 15 and the focal position based upon the detection results from the position detector 18. The voltage application unit 23 applies a voltage to the electrode 20 in order to correct tilting on the wafer 15 detected by the tilt detector 21. At this point, a voltage that corresponds to the necessary Z piezo elements 22 is applied to the electrode 20 in order to correct the detected tilting. Then, the tilting on the wafer 15 detected by the tilt detector 21 is corrected by extending and contracting the Z piezo elements 22 to which the voltage has been applied. Furthermore, the voltage application unit 23 causes the Z piezo elements 22 to contract and extend based upon the tilting on the wafer 15 detected by the tilt detector 21, and aberration or distortion in the lenses inside the optical projection system 4. Then, distortions in the subject image on the image plane are corrected, and a corrected circuit pattern whose distortions have been reduced or eliminated is imaged onto the exposure surface of the wafer 15. Furthermore, a fixing device 30 (not shown in the figures) is provided in the stepper, and serves to fix the wafer 15 thereto. Note that the same reference numerals used with the stepper of the present invention and the conventional stepper shown in FIG. 9 refer to the same structures.

In addition, the Z piezo elements 22 may be piezoelectric elements that are capable of being extended and contracted, and are not limited to piezo elements.

Operation

Next, an example of the stepper exposure method according to the first embodiment of the present invention will be described below. FIGS. 4 and 5 illustrate various operational states of the Z piezo elements 22. An exposure process software program that corresponds to the desired wafer exposure is read into the stepper.

Step S1: A pre-alignment unit (not shown in the figures) mounts and aligns a wafer 15 coated with a recording media such as a photoresist on top of the Z piezo elements 22 based upon the orientation flat, the alignment portions, or the like of the wafer 15.

Step S2: The fixing device 30 fixes the wafer 15 to the Z piezo elements 22. Examples of the fixing device 30 include a vacuum device, and maintains a vacuum between the Z piezo elements 22 and the wafer 15 in order to adhere the wafer 15 to the Z piezo elements 22.

Step S3: Next, tilting with respect to the optical axis 17 of the current shot region to which a circuit pattern is to be transferred is detected by means of the tilt detector 21.

Step S4: Based upon data on warping/uneven surfaces located on the wafer 15 that were detected by the tilt detector 21, and/or previously determined data on distortion and the like in the subject image on the image plane caused by aberration or distortion in the condenser lens 2 or in the lenses inside the optical projection system 4, the necessary Z piezo elements 22a, 22b, etc. are adjusted so that the image plane of the optical projection system 4 matches the exposure surface of the current shot region. When this occurs, the Z piezo elements 22a, 22b, etc that correspond to the current shot region are extended and contracted by means of a voltage applied to the electrode 20 from the voltage application unit 23 based upon the tilting detected by the tilt detector 21 and/or aberration or distortion in the lenses, and the tilting on the exposure surface in the current shot region is corrected as shown in FIGS. 4 and 5.

Step S5: After the image plane of the optical projection system 4 is matched with the exposure surface of the current shot region on the wafer 15, exposure occurs with the light from the light source 1, and the circuit patter of the reticle 3 is transferred to the current shot region on the wafer 15.

After this first exposure is completed, the XYZ stages are moved by the stage drive unit 19 based upon the exposure-process software program or the detection results from the position detector 18, and steps S3 to S5 are repeated in order to transfer the circuit pattern to the next shot region.

Figure 4A:
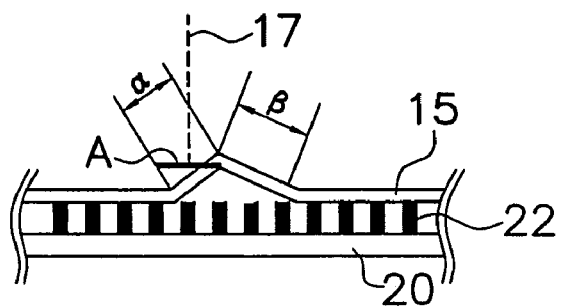
FIGS. 4A to 4D illustrate the operation of Z piezo elements in response to warping/uneven surfaces located on a wafer.
Figure 4B:
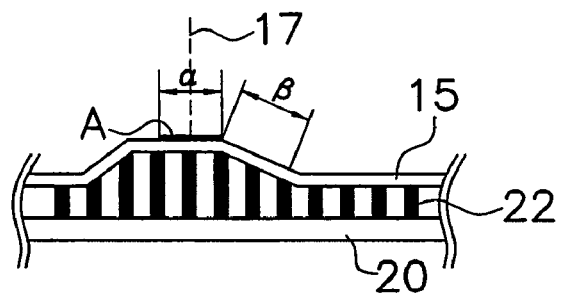
Figure 4C:
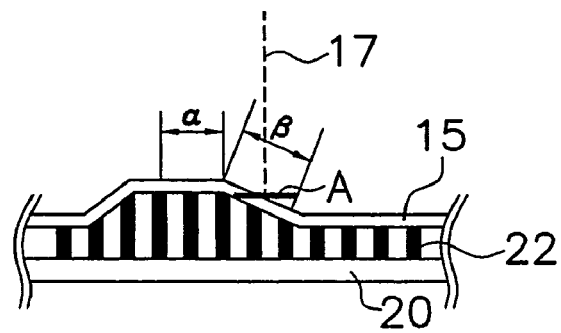
Figure 4D:
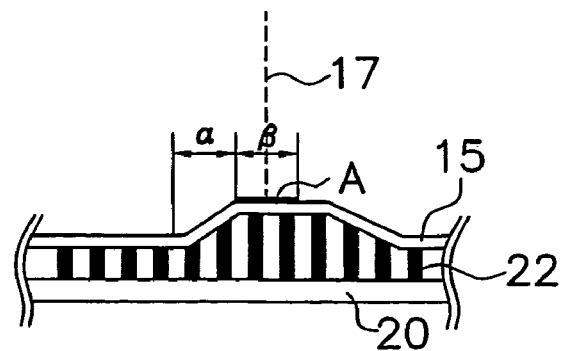

Next, the operation of the Z piezo elements 22 will be described in detail. FIGS. 4A to 4D illustrate the operation of the Z piezo elements 22 in response to a warp/uneven surface located on the wafer 15. Here, the shot region α is the current shot region, and the shot region β is the shot region to be exposed next after the current shot region. In FIG. 4A, the image plane A from the optical projection system 4 does not match because there is a warp/uneven surface located on the exposure surface of the shot region α on the wafer 15. Accordingly, as shown in FIG. 4B, a localized voltage is applied from the electrode 20 to the Z piezo elements 22 that correspond to the shot region α, and the exposure surface of the shot region α is matched with the image plane by extending the Z piezo elements 22. At this point, a voltage is applied from the voltage application unit 23 to the electrode 20 based upon the tilting detected by the tilt detector 21 and/or aberration or distortion in the lenses. When the exposure of the shot region a is completed, the stage moves to the next shot region β. As shown in FIG. 4C, the image plane A and the exposure surface do not match because the exposure surface of the shot region β on the wafer 15 has a warp/uneven surface. Thus, like with the shot region α, a localized voltage is applied from the electrode 20 to the Z piezo elements 22 that correspond to the shot region β, and as shown in FIG. 4D, the exposure surface of the shot region β is matched with the image plane and exposed by extending the Z piezo elements 22.

Figure 5A:
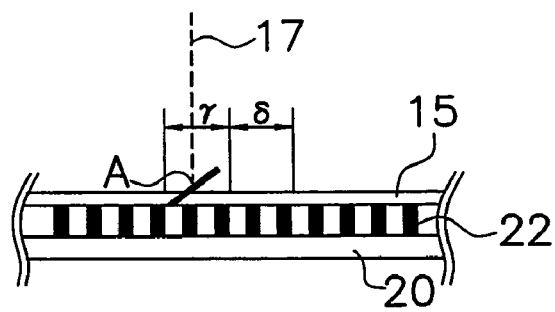
FIGS. 5A to 5D illustrate the operation of Z piezo elements in response to distortion of a subject image in an image plane caused by aberration or distortion in the lenses of the exposure device.
Figure 5B:
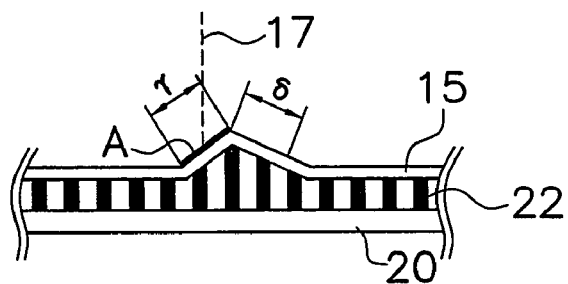
Figure 5C:
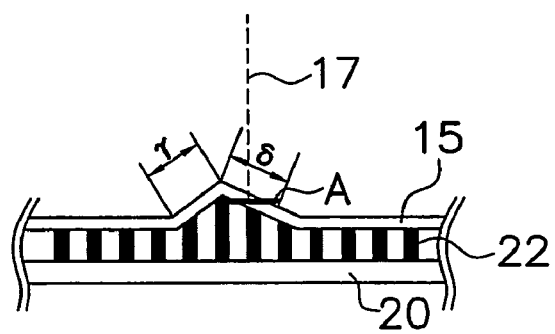
Figure 5D:
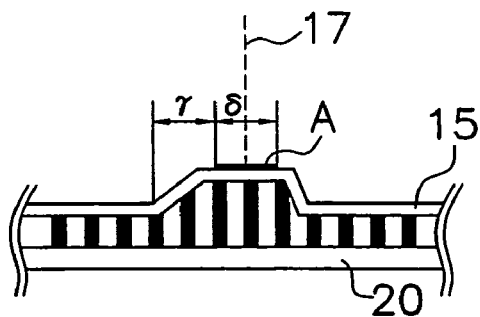

In addition, FIGS. 5A–5D illustrate the operation of the Z piezo elements 22 in response to distortion of the subject image in the image plane A caused by an aberration or distortion in the lenses. Here, the shot region γ is the current shot region, and the shot region δ is the shot region to be exposed next after the current shot region. In FIG. 5A, the shot region γ and image plane A and the exposure surface of the wafer 15 do not match, thereby producing a distortion in the subject image on the exposure surface. Accordingly, as shown in FIG. 5B, a localized voltage is applied from the electrode 20 to the Z piezo elements 22 that correspond to the shot region γ, and the exposure surface of the shot region γ is matched with the image plane by extending the Z piezo elements 22. When the exposure of the shot region γ is completed, the stage moves to the next shot region δ. As shown in FIG. 5C, the image plane A of the shot region δ does not match the exposure surface of the wafer 15. Thus, like with the shot region γ, a localized voltage is applied from the electrode 20 to the Z piezo elements 22 that correspond to the shot region δ, and as shown in FIG. 5D, the exposure surface of the shot region δ is matched with the image plane and exposed by extending the Z piezo elements 22.

The alignment sequence of the wafer 15 will differ according to the type of stepper and wafer used. Thus, the method of the present invention is not limited to the method described above, and will be performed in accordance with the type of stepper and wafer used.

Each Z piezo element 22 disposed at a predetermined gap from each other is independently driven, and the exposure surface on the wafer 15 will be matched with the image plane A of the optical projection system 4 for each current shot region. Thus, distortion of the subject image in the image plane caused by warping/uneven surfaces located on the wafer 15 and/or aberration or distortion in the lenses can be locally corrected, i.e., can be corrected for each current shot region. This allows the speed at which the tilting on the wafer 15 is corrected to be increased, and allows a reduction in the time needed for the entire exposure process. In addition, a reduction in the time needed for the entire exposure process and a reduction in the amount of power consumed can be obtained by employing the Z piezo elements 22 and selectively extending and contracting the required Z piezo elements 22.

Furthermore, warping/uneven surfaces located on the wafer 15 caused by foreign substances adhered to the rear surface of the wafer 15 can be reduced because there is a small contact surface area between each Z piezo element 22a, 22b, etc. and the rear surface of the wafer 15.

EXAMPLE

Figure 6:
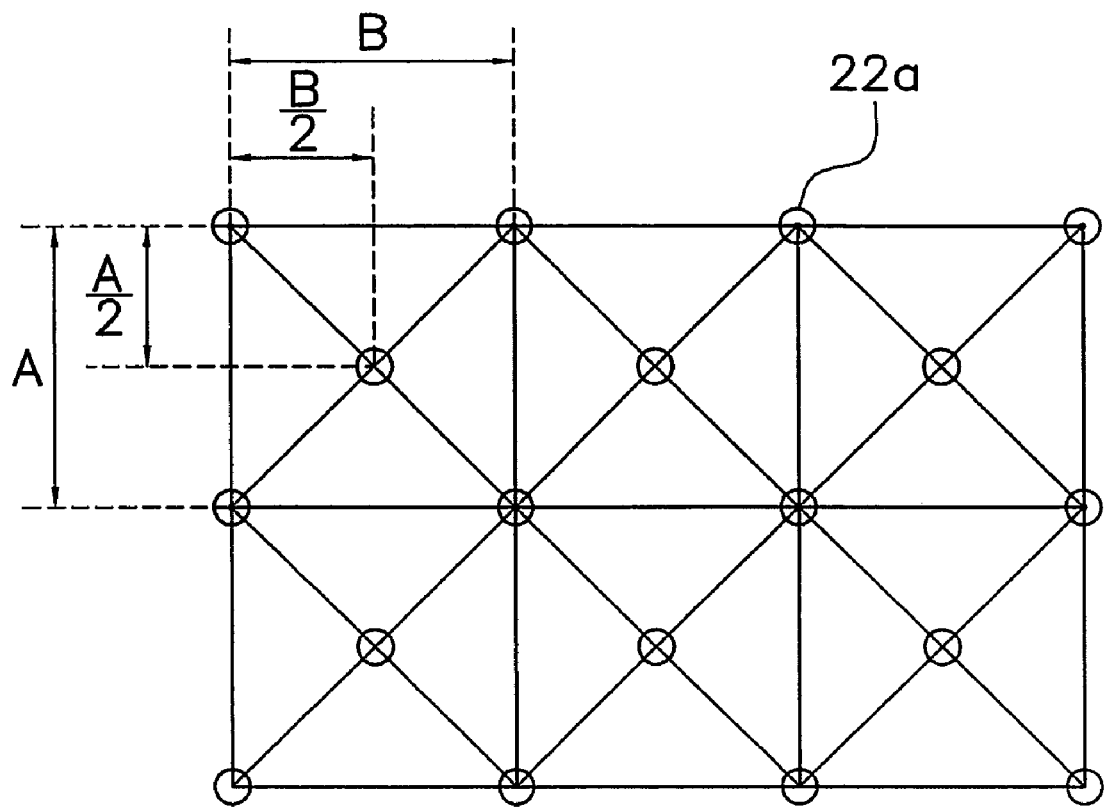
FIG. 6 is a plan view illustrating detection positions on an exposure surface of a wafer where tilting is to be measured by a tilt detector.

An example of the stepper according to the first embodiment will now be described in detail by employing FIGS. 1 to 6. FIG. 6 is a plan view that illustrates detection positions on an exposure surface of a wafer where tilting is to be measured by the tilt detector 21. Other than the layout of the Z piezo elements 22, the stepper in this example has the same configuration and operates in the same way as the stepper of the first embodiment shown in FIGS. 1 to 5.

The region labeled as A, B on the left side of FIG. 6 corresponds to 1 shot region on the wafer 15. The tilt detector 21 detects any warping/uneven surfaces/tilting at the four corners and center of the shot region A, B on the wafer 15. The Z piezo elements 22 are arranged on the rear surface of the wafer 15 so that they correspond to the positions of the 4 corners and center. For example, if a 5 inch reticle is used as the reticle 3, the size of the shot region A, B on the exposure surface of the wafer 15 will be a 20 mm×20 mm square. Then, the rear surface of the wafer 15 will be supported by the Z piezo elements 22 so that the detection positions shown in FIG. 6 are matched with the Z piezo elements 22 and the gap between the four corners of the Z piezo elements 22 is substantially A=20 mm, B=20 mm, and so that the central Z piezo element 22 is substantially positioned in the center of the square A, B. In addition, if a 6 inch reticle is used as the reticle 3, the size of the 1 shot region on the exposure surface of the wafer 15 will be a 22 mm×22 mm square. Then, like that described above, the rear surface of the wafer 15 is supported by the Z piezo elements 22 so that the detection positions shown in FIG. 6 are matched with the Z piezo elements 22 and the gap between the four corners of the Z piezo elements 22 is substantially A=22 mm, B=22 mm, and so that the central Z piezo element 22 is substantially positioned in the center of the square A, B.

As described above, the Z piezo elements 22 are arranged on the four corners and center of each shot region on the wafer 15 so that they correspond to the detection positions on each shot region where warping/uneven surfaces/tilting will be measured. Thus, warping/uneven surfaces/tilting on the wafer 15 can be corrected based upon the tilting detected at the corresponding detection positions. Likewise, based upon aberration or distortion in the lenses of the optical projection system 4 and the tilting detected on the wafer 15, distortions in the subject image in the image plane can be properly corrected, and a corrected circuit pattern can be imaged onto the exposure surface of the wafer 15. For example, distortion in the subject image on the exposure surface of the wafer 15 can be reduced by tilting the wafer 15 such that the subject image on the image plane matches the aberration or the distortion of the lenses.

The layout of the Z piezo elements 22 is not limited to the four corners and center of 1 shot region, and may be arranged to correspond to the detection positions of the tilt detector 21. It will normally be preferable to arrange the Z piezo elements 22 in 5 locations that correspond to the detection positions on each shot region on the wafer 15 if warping/uneven surfaces/tilting in each shot region is measured at the four corners and center thereof, and if the contact surface area between the Z piezo elements 22 and the rear surface of the wafer 15 is to be reduced.

Second Embodiment

Figure 7A:
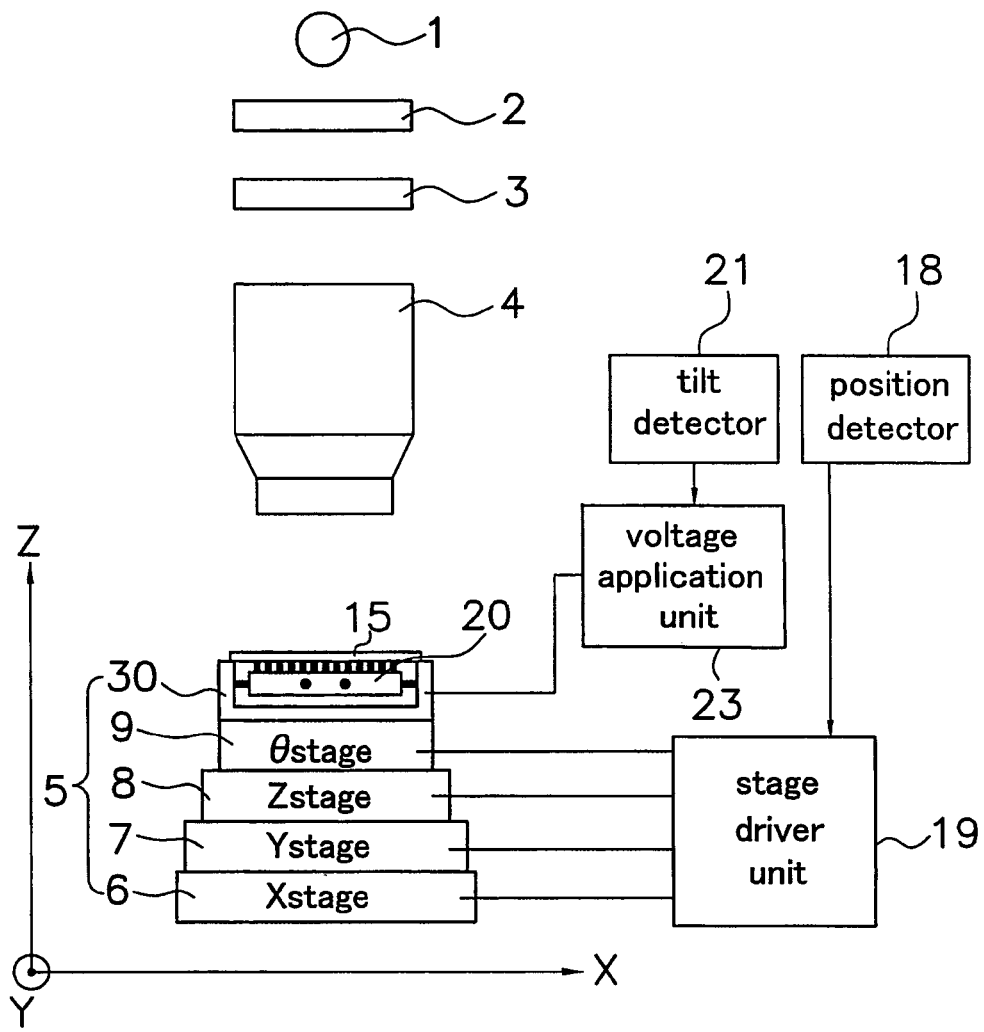
FIG. 7A is a schematic diagram of a stepper according to a second embodiment of the present invention.

A stepper according to a second embodiment of the present invention will be described with reference to FIGS. 6, 7 and 8. FIG. 7A is a schematic diagram of a stepper according to the second embodiment, FIG. 7A is an enlarged view of essential portions of the stepper of FIG. 7A, and FIG. 8 is a plan view of essential portions of the stepper of FIG. 7A.

Configuration

Figure 7B:
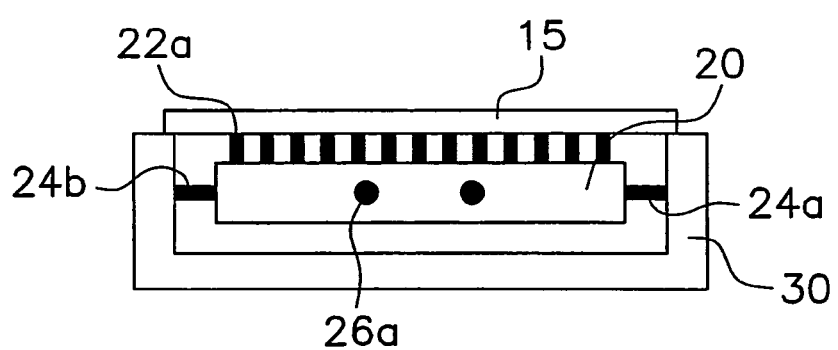
FIG. 7B is an enlarged view of essential elements of the stepper shown in FIG. 7A.
Figure 8:
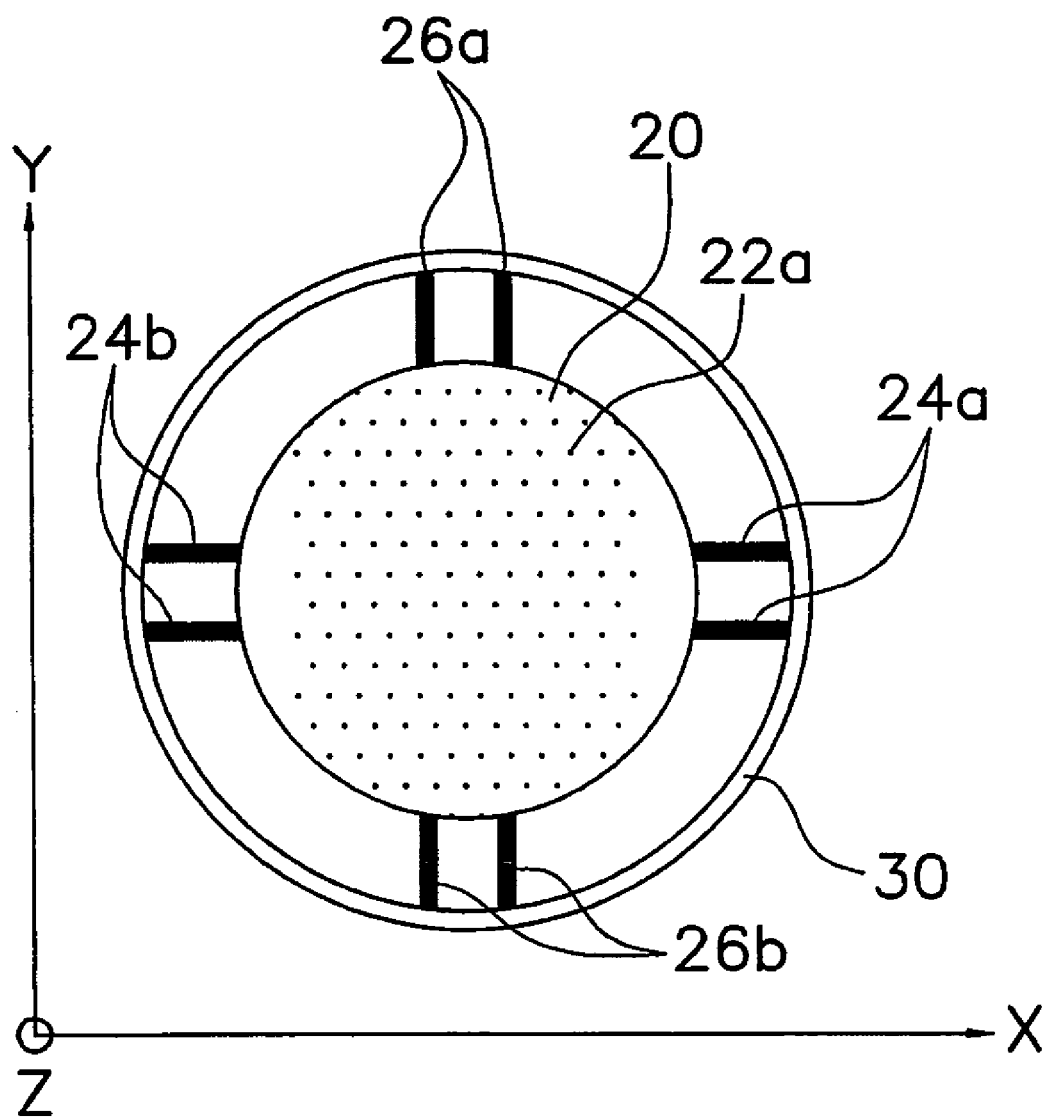
FIG. 8 is a plan view of essential elements of the stepper shown in FIG. 7A.

As shown in FIG. 7, the fixing device 30 is mounted on top of the θ stage 9, and the electrode 20 is arranged inside the fixing device 30. As shown in FIGS. 7 and 8, the electrode 20 is installed in the fixing device 30 by means of piezo elements (hereinafter X piezo elements) 24a, 24b that extend and contract in the X axis direction (in FIG. 8) in a plane that extends along the electrode 20, and piezo elements (hereinafter Y piezo elements) 26a, 26b that extend and contract in the Y axis direction (in FIG. 8) that is perpendicular to the X axis direction. In addition, a plurality of Z piezo elements 22a, 22b are arranged on the XY plane of the electrode 20 in the layout shown in FIG. 6, and the wafer 15 is mounted on top of the Z piezo elements 22. Here, the X piezo elements 24a, 24b extend and contract in the plane that is perpendicular to the optical axis 17, i.e., the X axis direction in FIG. 8, and move the wafer 15 on the electrode 20 in the X axis direction. On the other hand, the Y piezo elements 26a, 26b extend and contract in the Y axis direction (in FIG. 8) that is perpendicular to the X axis direction, and moves the wafer 15 in the Y axis direction. When the electrode 20 is connected to the fixing device 30 via only the X piezo elements 24 and the Y piezo elements 26, the movement in the X axis and the Y axis directions will be made easier, and is thus preferred. The fixing device 30 shown in FIGS. 7 and 8 is configured such that the wafer 15 will form the lid of the fixing device 30 and fixes the wafer 15 by means of a vacuum. However, the present invention is not limited to the aforementioned configuration, and may be configured in any way that allows the wafer 15 to be fixed to the Z piezo elements 22. In addition, the number of Z piezo elements 24 and Y piezo elements 26 is not limited, and may be any number that allows the wafer 15 to move in the X axis and Y axis directions. The layout of the Z piezo elements 22 is the same as that shown in FIG. 6. Other than the configuration described above, the configuration of the stepper of the second embodiment is identical to that of the first embodiment.

Operation

Next, an example of the stepper exposure method according to the second embodiment of the present invention will be described below. An exposure process software program that corresponds to the desired wafer exposure is read into the stepper.

Step S11: A pre-alignment unit (not shown in the figures) mounts and positions the wafer 15 on the Z piezo elements 22.

Step S12: The Z piezo elements 24 and the Y piezo elements 26 move the wafer 15 so that the detection positions on the wafer 15 used by the tilt detector 21 (see FIG. 6) match the positions of the Z piezo elements 22 on the electrode 20 that supports the wafer 15.

Step S13: The fixing device 30 fixes the wafer 15 to the Z piezo elements 22.

Step S14: Next, tilting on the exposure surface of the wafer 15 inside the current shot region with respect to the optical axis 17 is detected by means of the tilt detector 21.

Step S15: Based upon data on the warping/uneven surfaces located on the wafer 15 that were detected by the tilt detector 21, and/or previously determined data on distortion and the like in the subject image on the image plane caused by aberration or distortion in the condenser lens 2 or in the lenses inside the optical projection system 4, the necessary Z piezo elements 22a, 22b, etc. are adjusted so that the image plane of the optical projection system 4 matches the exposure surface of the wafer 15 inside the shot region. When this occurs, based upon the detection results of tilt detector 21 and/or the aberration or distortion in the lenses, each of the Z piezo elements 22a, 22b, etc. corresponding to the current shot region will extend by means of a voltage applied from the voltage application unit 23 to the electrode 20, and the tilting on the exposure surface inside the current shot region will be corrected.

Step S16: Exposure is performed by shining light from the light source 1, and the circuit pattern the reticule 3 is transferred to the current shot region of the wafer 15.

After this first exposure is completed, the XYZ stages are moved by the stage drive unit 19 based upon the exposure process software program or the detection results from the position detector 18, and steps S14 to S16 are repeated in order to transfer the circuit pattern to the next shot region.

In addition, slight misalignment of the wafer 15 in the X axis and Y axis directions may be corrected by means of the X piezo elements 24 and the Y piezo elements 26.

The X piezo elements 24 and the Y piezo elements 26 move the wafer 15 such that the detection positions of the tilt detector 21 match the positions of the Z piezo elements 22 that support the wafer 15. Thus, tilting between the exposure surface of the current shot region and the image frame can be properly corrected based upon warping/uneven surfaces located on the wafer 15 detected in the detection positions and/or distortion in the subject image in the image plane caused by aberration or distortion in the condenser lens 2, lenses inside the optical projection system 4, or the like.

In addition, by locally correcting misalignment of the wafer 15 in the X axis and Y axis direction by means of the X piezo elements and the Y piezo elements, the speed at which this correction takes place can be increased, the time needed for the entire exposure process can be reduced, and the electric power consumption of the stepper can be reduced.

Although the aforementioned embodiments describe the use of silicon wafers with the exposure device and the exposure method of the present invention, the present invention is not limited thereto. It will be readily apparent to one of ordinary skill in the art that the present invention may be adapted for use with other types of substrates.

Any terms of degree used herein, such as "substantially", "about" and "approximately", mean a reasonable amount of deviation of the modified term such that the end result is not significantly changed. These terms should be construed as including a deviation of at least ±5% of the modified term if this deviation would not negate the meaning of the word it modifies.

This application claims priority to Japanese Patent Application No. 2003-131674. The entire disclosure of Japanese Patent Application No. 2003-131674 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. An exposure device that repeatedly projects and transfers a predetermined pattern formed on a reticule onto a substrate via an optical projection system, the exposure device comprising:
    movement means that positions a current shot region on the substrate in a focal position of the optical projection system;
    detection means that detects tilting of an exposure surface of the current shot region with respect to an image plane of the optical projection system; and
    a plurality of first piezoelectric elements that correct tilting in the current shot region with respect to an optical axis of the optical projection system, based upon detection results from the detection means, so that the exposure surface of the current shot region will substantially match the image plane, the first piezoelectric elements arranged such that they substantially correspond to the center and four corners of the current shot region.

2. The exposure device set forth in claim 1, further comprising fixing means that fixes the substrate to the first piezoelectric elements; and
    wherein the plurality of first piezoelectric elements are disposed in a predetermined spaced relationship such that they support a rear surface of the substrate.

3. The exposure device set forth in claim 1, wherein the first piezoelectric elements are arranged to correspond to tilting detection positions of the detection means.

4. The exposure device set forth in claim 1, further comprising second piezoelectric elements that move the substrate in directions that are perpendicular to the optical axis.

5. The exposure device set forth in claim 1, wherein the first piezoelectric elements are piezo elements.

6. The exposure device set forth in claim 1, wherein the substrate is a silicon wafer.

7. The exposure device set forth in claim 1, wherein the substrate includes a recording media applied thereto.

8. The exposure device set forth in claim 7, wherein the recording media is a positive resist material.

9. The exposure device set forth in claim 7, wherein the recording media is a negative resist material.

10. An exposure method of an exposure device that repeatedly projects and transfers a predetermined pattern formed on a reticule onto a substrate via an optical projection system, the exposure method comprising the steps of:
    fixing the substrate to a plurality of first piezoelectric elements arranged in a predetermined spaced relationship such that the first piezoelectric elements support a rear surface of the substrate;
    positioning a current shot region on the substrate in a focal position of the optical projection system;
    detecting tilting of an exposure surface of the current shot region with respect to an image plane of the optical projection system; and
    correcting tilting of the current shot region with respect to an optical axis of the optical projection system with the plurality of first piezoelectric elements, based upon detection results of the detection step, so that the exposure surface of the current shot region will substantially match the image plane, the first piezoelectric elements arranged such that they substantially correspond to the center and four corners of the current shot region.

11. The exposure method set forth in claim 10, wherein correction of the tilting is performed by means of the first piezoelectric elements arranged to correspond to tilting detection positions.

12. The exposure method set forth in claim 10, further comprising the step of causing the detection positions to be substantially matched with the positions of the first piezoelectric elements by means of second piezoelectric elements that move the substrate in directions perpendicular to the optical axis.

13. The exposure method set forth in claim 10, wherein the first piezoelectric elements are piezo elements.

14. The exposure method set forth in claim 10, wherein the substrate is a silicon wafer.

15. The exposure method set forth in claim 10, wherein the substrate includes a recording media applied thereto.

16. The exposure method set forth in claim 15, wherein the recording media is a positive resist material.

17. The exposure method set forth in claim 15, wherein the recording media is a negative resist material.

* * * * *